(12) United States Patent
Shibayama et al.

(10) Patent No.: US 10,007,298 B2
(45) Date of Patent: Jun. 26, 2018

(54) DOCKING STATION AND ELECTRONIC DEVICE SYSTEM

(71) Applicant: LENOVO (SINGAPORE) PTE. LTD., Singapore (SG)

(72) Inventors: Yoshiyuki Shibayama, Takasaki (JP); Yuta Tsuganezawa, Yokohama (JP); Eiji Shinohara, Kawasaki (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 37 days.

(21) Appl. No.: 15/244,621

(22) Filed: Aug. 23, 2016

(65) Prior Publication Data

US 2017/0344060 A1 Nov. 30, 2017

(30) Foreign Application Priority Data

May 27, 2016 (JP) .................................. 2016-106517

(51) Int. Cl.
*G06F 1/16* (2006.01)
*G06F 1/20* (2006.01)
*G06F 13/00* (2006.01)
*H05K 7/20* (2006.01)

(52) U.S. Cl.
CPC .......... *G06F 1/1632* (2013.01); *G06F 1/1616* (2013.01); *G06F 1/203* (2013.01); *G06F 1/206* (2013.01); *H05K 7/2049* (2013.01); *H05K 7/20272* (2013.01); *H05K 7/20409* (2013.01)

(58) Field of Classification Search
CPC ........ G06F 1/1632; G06F 1/203; G06F 1/206; H05K 7/20409; H05K 7/20272
USPC .......... 361/679.41–679.47, 679.54; 710/303, 710/304
See application file for complete search history.

(56) References Cited

U.S. PATENT DOCUMENTS

| 5,537,343 | A | * | 7/1996 | Kikinis | G06F 1/1626 361/679.56 |
| 5,704,212 | A | * | 1/1998 | Erler | F25B 21/04 361/679.41 |
| 5,784,253 | A | * | 7/1998 | Ooka | G06F 1/1632 361/679.43 |
| 5,884,049 | A | * | 3/1999 | Atkinson | G06F 1/1632 361/679.41 |
| 6,191,943 | B1 | * | 2/2001 | Tracy | G06F 1/1632 361/679.46 |
| 6,275,945 | B1 | * | 8/2001 | Tsuji | G06F 1/1632 361/679.4 |
| 6,453,378 | B1 | * | 9/2002 | Olson | G06F 1/1632 361/679.41 |
| 7,633,750 | B2 | * | 12/2009 | Fan | G06F 1/1632 361/679.41 |
| 9,720,464 | B2 | * | 8/2017 | Burr | G06F 1/203 |
| 2014/0192480 | A1 | * | 7/2014 | Winkler | G06F 1/203 361/679.47 |

* cited by examiner

*Primary Examiner* — Nidhi Thaker
(74) *Attorney, Agent, or Firm* — Shimokaji IP

(57) ABSTRACT

There is provided a docking station capable of docking and undocking a portable computing device. The docking station includes: an engaging lever engageable with an engaging hole located in a portable computing device; and a docking sensor which detects when the engaging lever is engaged with the engaging hole.

8 Claims, 9 Drawing Sheets

DOCKING STATION AND ELECTRONIC DEVICE SYSTEM

FIELD OF THE INVENTION

The present invention relates to a docking station capable of docking and undocking a portable computing device.

BACKGROUND OF THE INVENTION

Conventionally, there have been docking stations capable of docking and undocking portable computing devices.

SUMMARY OF THE INVENTION

It is an object of the present invention to provide a docking station capable of docking and undocking a portable computing device.

A docking station according to the present disclosure includes an engaging lever engageable with an engaging hole provided in a portable computing device, and a docking sensor which detects a state where the engaging lever is engaged with the engaging hole.

According to the present invention, there is provided a docking station capable of docking and undocking a portable computing device.

DETAILED DESCRIPTION OF THE INVENTION

Figure 1:
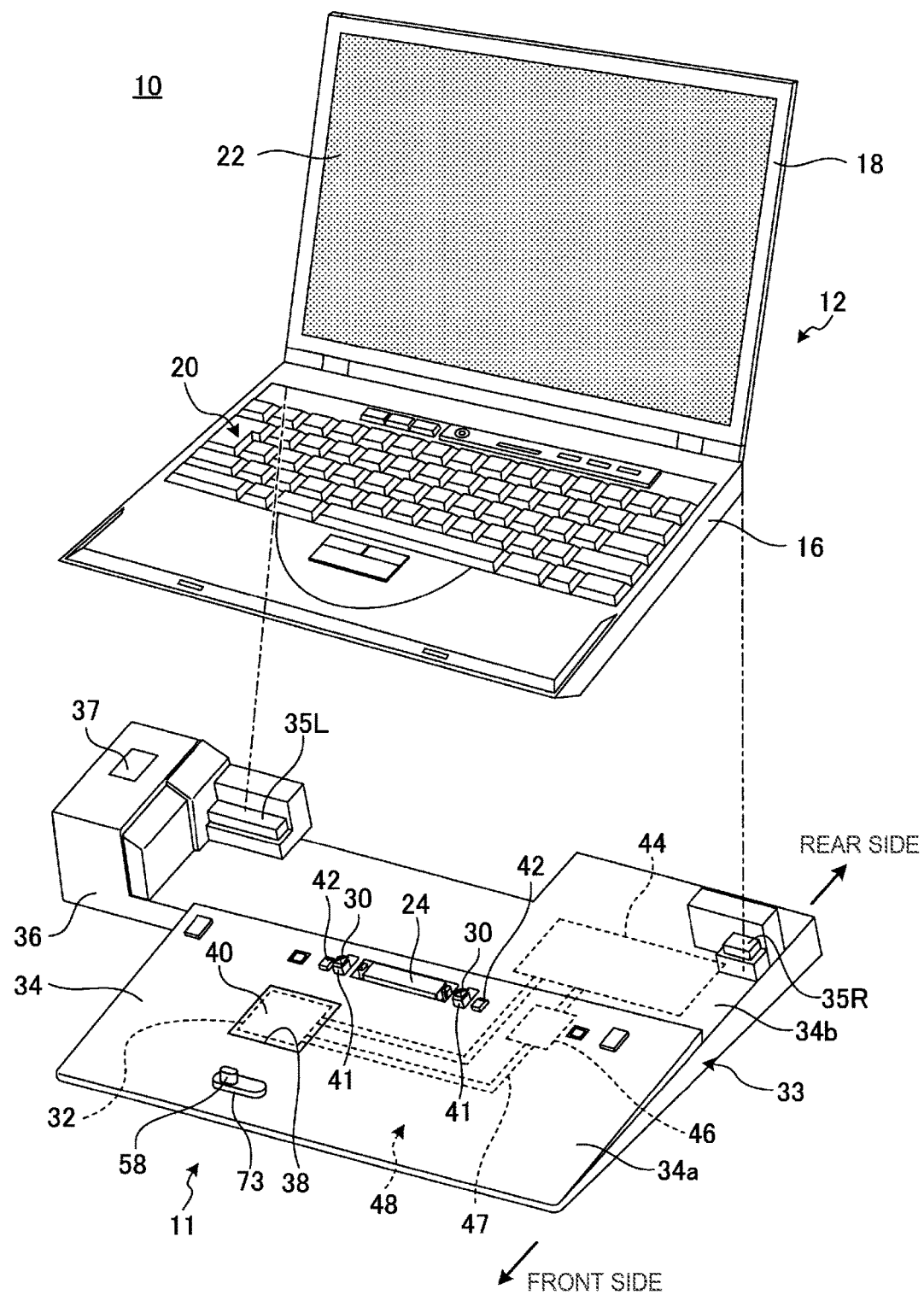
FIG. 1 is a configuration diagram of an electronic device system according to the present disclosure.
Figure 2:
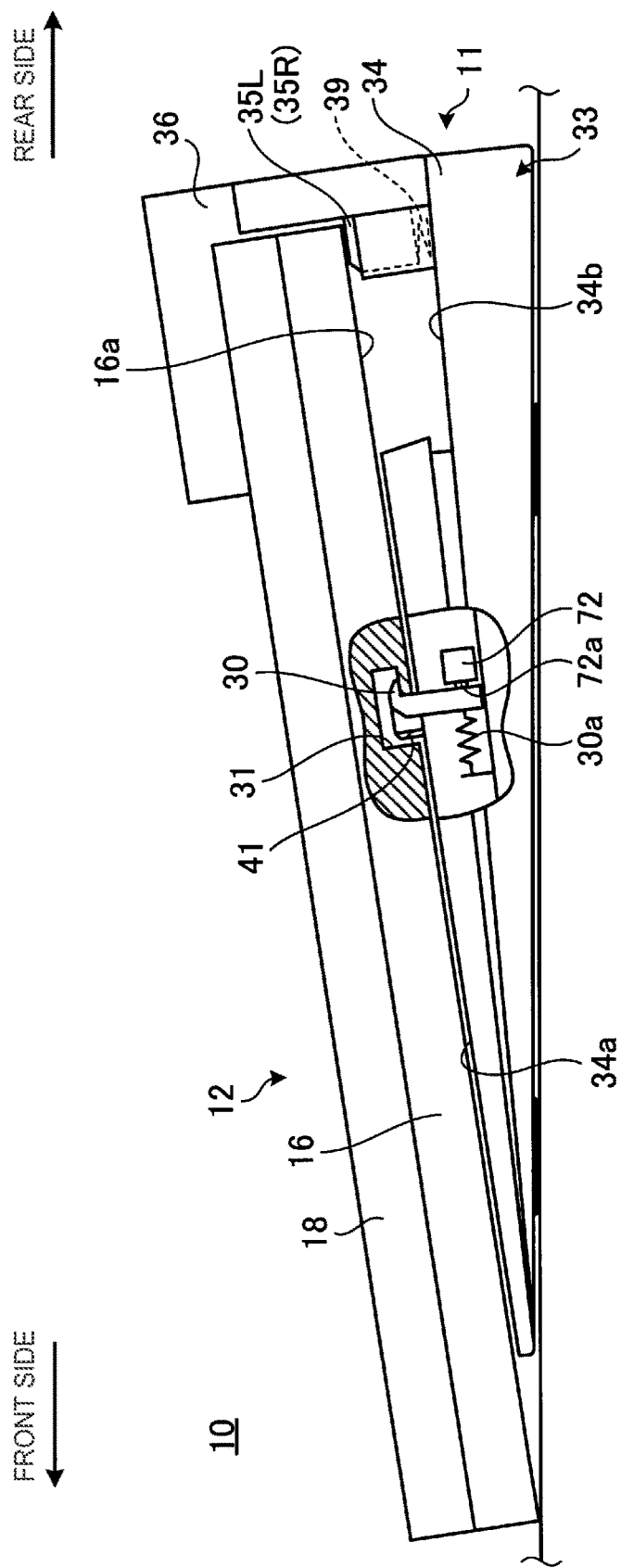
FIG. 2 is a partially sectional side view in a state where a docking station and a portable computing device illustrated in FIG. 1 are connected.
Figure 3:
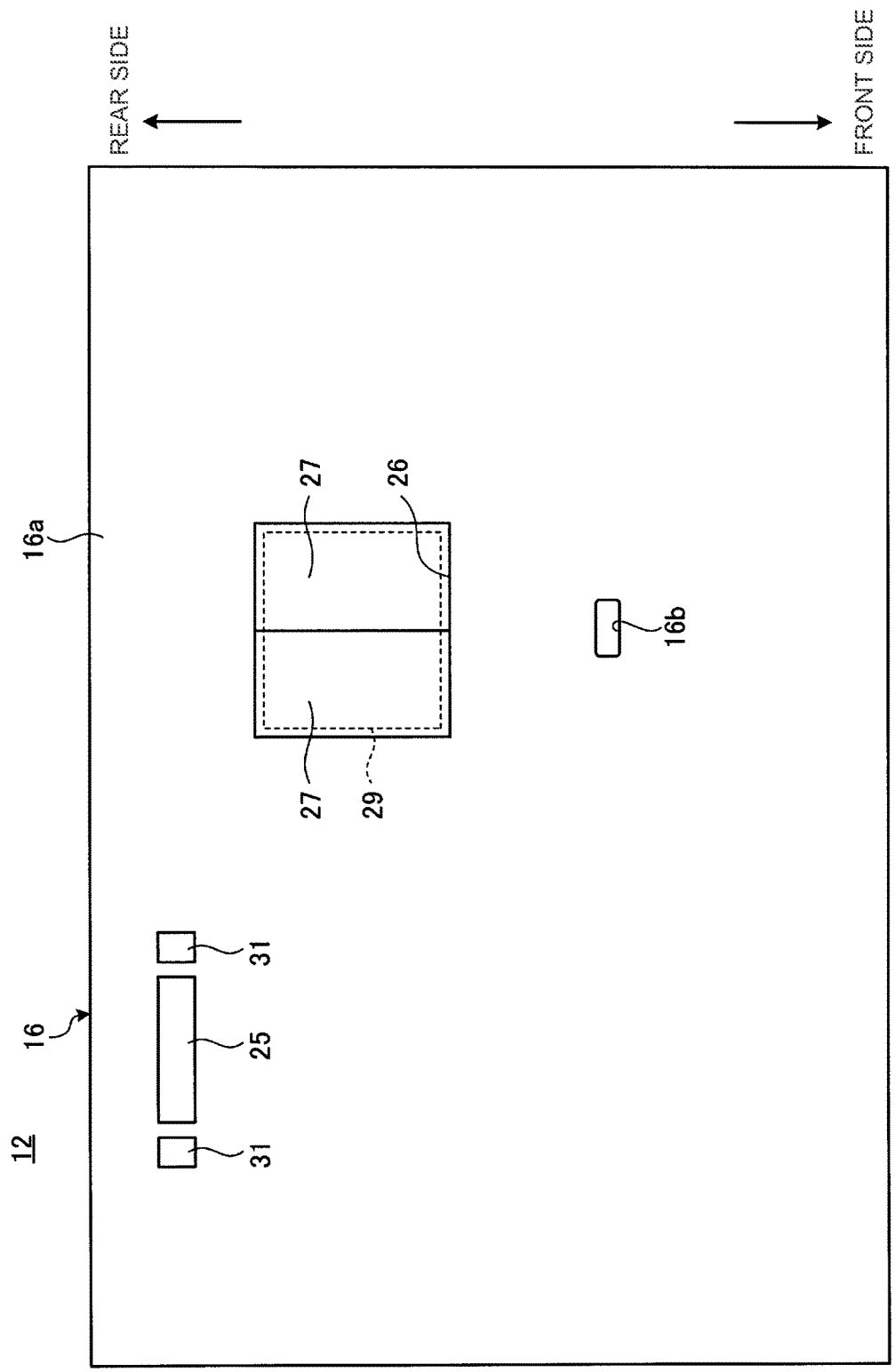
FIG. 3 is a bottom view schematically illustrating the structure of a bottom face of the portable computing device illustrated in FIG. 1.

FIG. 1 is a configuration diagram of an electronic device system 10 according to the present disclosure, which is a perspective view in a state where a docking station 11 and a portable computing device 12 are separated from each other. FIG. 2 is a partially sectional side view in a state where the docking station 11 and the portable computing device 12 illustrated in FIG. 1 are connected. FIG. 3 is a bottom view schematically illustrating the structure of a bottom face 16a of the portable computing device 12 illustrated in FIG. 1.

The present disclosure exemplifies the electronic device system 10 in which a laptop PC as an example of the portable computing device 12 is connected to the docking station 11 as a cooling device to reinforce the cooling function of the portable computing device 12. The docking station 11 may have a function to extend/reinforce a processing function of the portable computing device 12, a power supply function, and a connection function to a peripheral device or a network. The portable computing device 12 may be any device other than the laptop PC, that is, for example, it may be a tablet PC, a smartphone, or the like.

First, the general configuration of the electronic device system 10 will be described.

As illustrated in FIG. 1, the portable computing device 12 has a clamshell type structure in which a display chassis 18 is coupled openably and closably to a main body chassis 16. A keyboard 20 is provided on the top face of the main body chassis 16. A display 22 is provided on the front face of the display chassis 18.

As illustrated in FIG. 2 and FIG. 3, a connector 25 electrically connected to a connector 24 of the docking station 11, a rectangular opening 26, and a pair of engaging holes 31 are provided in the bottom face 16a of the main body chassis 16. The opening 26 is covered with a shutter member 27 openably and closably. The shutter member 27 is, for example, of a sliding double-opening structure. A heat-radiating side heat sink 29 openably and closably covered with the shutter member 27 is arranged inside the opening 26. The engaging holes 31 can be engaged with engaging levers 30 protruding from the side of the docking station 11.

The connector 25 is connected to an unillustrated substrate housed inside the main body chassis 16. The heat-radiating side heat sink 29 comes into contact with a heat-receiving side heat sink 32 on the side of the docking station 11 to extend the cooling function of the portable computing device 12. When the heat-radiating side heat sink 29 and the heat-receiving side heat sink 32 are brought into contact with and thermally connected to each other, heat generated inside the portable computing device 12 can be transmitted to the docking station 11 to radiate the heat to the outside. The shutter member 27 is to prevent the heat-radiating side heat sink 29 becoming a high temperature from being always exposed on the bottom face 16a of the portable computing device 12.

As illustrated in FIG. 1 and FIG. 2, the docking station 11 is used in a state where the main body chassis 16 of the portable computing device 12 is placed thereon. The docking station 11 is configured such that a PC placing part 34 and an operation part 36 are provided on a device chassis 33 formed out of a synthetic resin material or a metallic material.

The PC placing part 34 is a box body having a top face large enough to place the portable computing device 12 thereon. The PC placing part 34 has a placing face 34a and a flank face 34b. The placing face 34a is so inclined that the height will be increased gradually from the front side to the rear side to form a surface on which the bottom face 16a of the portable computing device 12 is landed. The flank face 34b is formed to be one step lower than the rear side of the placing face 34a. The flank face 34b is a lower part provided to stay away from an unillustrated battery or the like when the battery or the like projects from the rear bottom face of the portable computing device 12.

Supporting members 35L and 35R are provided in rear right and left end portions of the flank face 34b, respectively. The supporting members 35L and 35R are cushioning members provided to support the rear end portions of the bottom face 16a of the portable computing device 12 to be movable up and down. Each of the supporting members 35L and 35R is biased in a rising direction by an elastic body 39 such as a coil spring. When being pressed by the weight of the portable computing device 12, the supporting member 35L, 35R falls against the biasing force of the elastic body 39 (see FIG. 2), while when being not given the weight of the portable computing device 12, the supporting member 35L, 35R rises (see FIG. 1).

The operation part 36 is a rectangular parallelepiped part having a height greater than that of the PC placing part 34. The operation part 36 is provided in a rear position of one side of the PC placing part 34 (one side of the flank face 34b). The operation part 36 has an eject button 37 and an unillustrated key insertion hole. The eject button 37 is an operation button operated when the portable computing device 12 connected to the docking station 11 is removed. The key insertion hole is an opening into which an unillustrated wire type lock key is inserted. When the lock key is inserted into the key insertion hole to perform a lock operation, an input operation to the eject button 37 is disabled. This prevents the portable computing device 12 from being removed from the docking station 11 to protect against the theft of the portable computing device 12.

The connector 24 and a shutter member 40 openably and closably covering an opening 38 formed in the placing face 34a are provided on the placing face 34a. The heat-receiving side heat sink 32 is arranged inside the opening and covered openably and closably with the shutter member 40.

The connector 24 is connected to an unillustrated substrate or the like housed inside the PC placing part 34 to protrude from the placing face 34a. The connector 24, which constitutes connection terminals of various extended functions provided in the docking station 11, is connected to the connector 25 provided on the bottom face 16a of the portable computing device 12. When the connector 25 is connected to the connector 24, the docking station 11 and the portable computing device 12 are electrically connected, and this enables the portable computing device 12 to use the various extended functions provided in the docking station 11.

The engaging levers 30 protrude from the right and left sides of the connector 24, respectively, and upper portions thereof are exposed on the placing face 34a. Each engaging lever 30 is biased by a lever spring 28 in a direction (rearward) of being engaged with each of the engaging holes 31. A guide post 41 having a U-shape in plan view to surround three sides, i.e., the front side and the right and left sides of the engaging lever 30 is formed to protrude. When the portable computing device 12 is connected to the docking station 11, the guide post 41 is inserted together with the engaging lever 30 into the engaging hole 31 on the side of the portable computing device 12 to serve as a positioning pin for positioning the portable computing device 12 with respect to the device chassis 33. Further, an eject member 42 is provided at the side of each guide post 41 on the placing face 34a, respectively. When the portable computing device 12 is removed from the docking station 11, the eject member 42 rises after the engaged state of the engaging lever 30 with the engaging hole 31 is released to push up the bottom face 16a of the portable computing device 12.

Next, a cooling structure of the portable computing device 12 by the docking station 11 will be specifically described.

Figure 4:
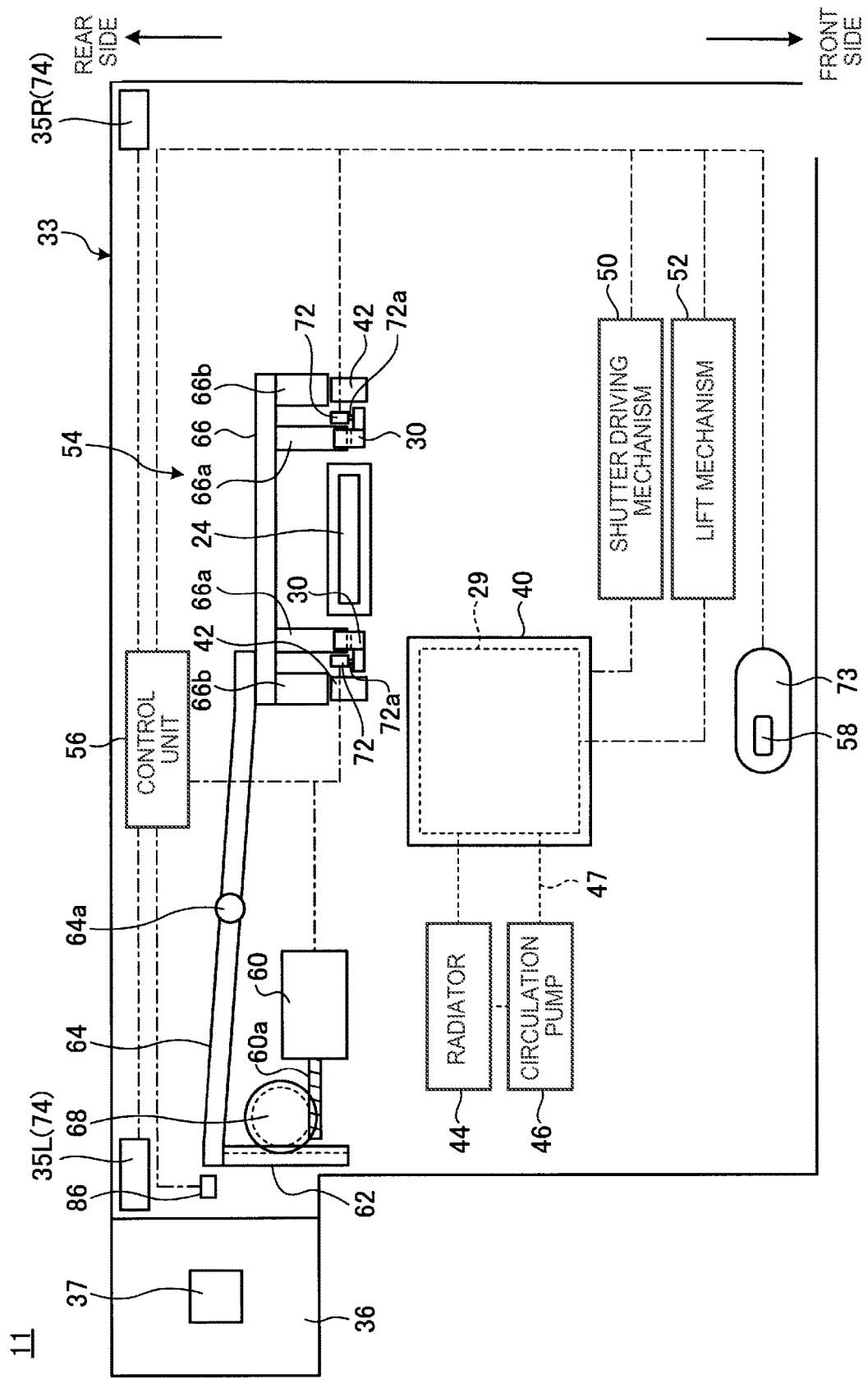
FIG. 4 is a plan view schematically illustrating an inner structure of the docking station.
Figure 5:
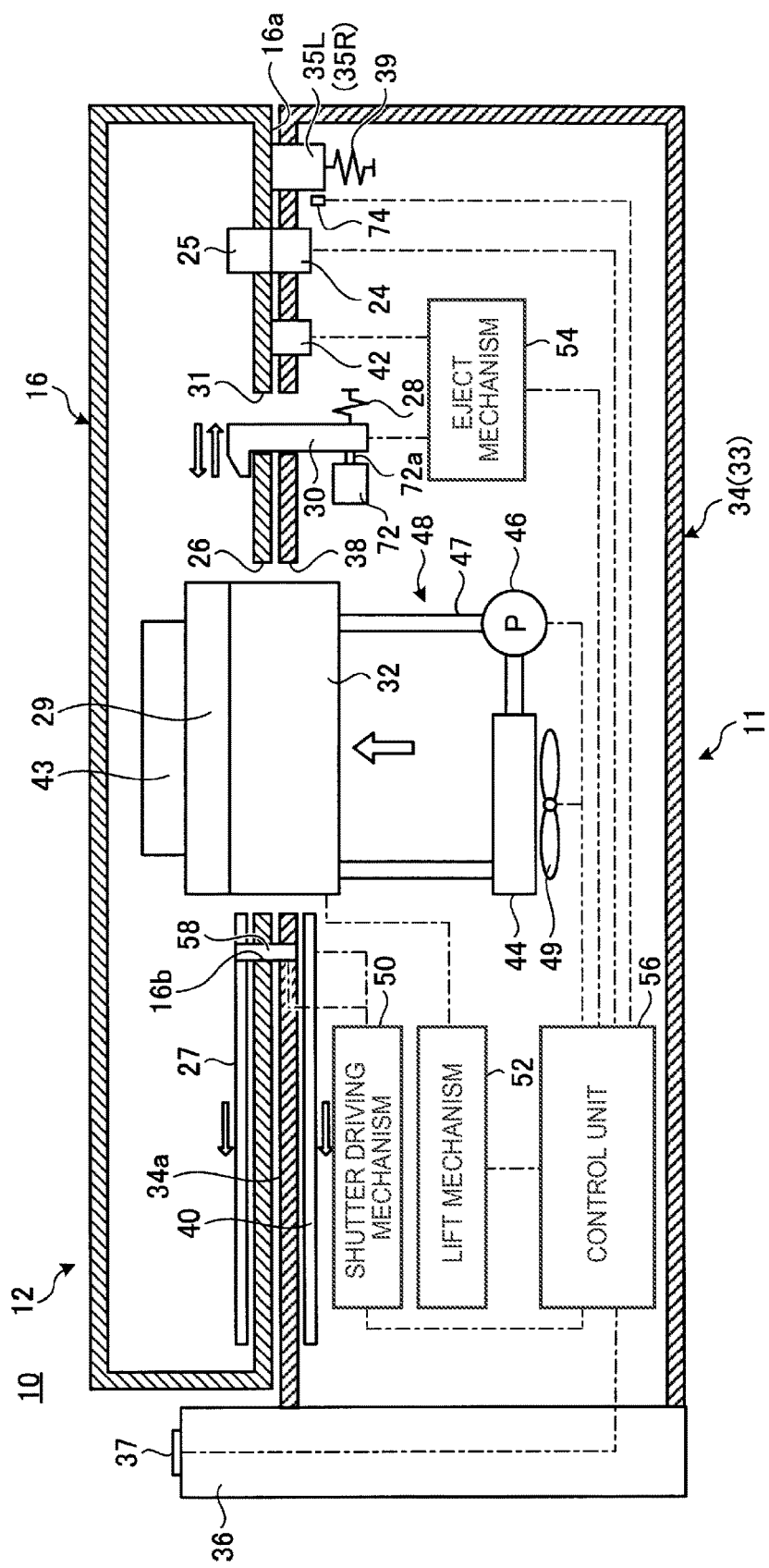
FIG. 5 is a side view schematically illustrating the inner structure when the docking station and the portable computing device are connected.

FIG. 4 is a plan view schematically illustrating an inner structure of the docking station 11. FIG. 5 is a side view schematically illustrating the inner structure when the docking station 11 and the portable computing device 12 are connected.

As illustrated in FIG. 3 and FIG. 5, the portable computing device 12 has, in the bottom face 16a, the heat-radiating side heat sink 29 provided openably and closably with the shutter member 27. The heat-radiating side heat sink 29 is a rectangular plate-like member made of a metallic material having high thermal conductivity such as copper or aluminium. The heat-radiating side heat sink 29 is thermally connected to a heating element 43 provided inside the main body chassis 16. The heating element 43 is an electronic component such as a CPU (Central Processing Unit) or a GPU (Graphics Processing Unit). Heat generated by the heating element 43 is transmitted efficiently to the heat-radiating side heat sink 29.

As illustrated in FIG. 1, FIG. 4, and FIG. 5, the docking station 11 includes a water-cooling unit 48 for circularly connecting the heat-receiving side heat sink 32, a radiator 44, and a circulation pump 46 through piping 47 to circulate cooling water.

The heat-receiving side heat sink 32 is a rectangular plate-like member made of a metallic material having high thermal conductivity such as copper or aluminium. Inlet piping 47 and outlet piping 47 are connected to the heat-receiving side heat sink 32 so that the cooling water will circulate in a cooling water circulating space with unillustrated fins arranged internally. This cooling water circulating space is formed inside of a thin lid that forms the top face of the heat-receiving side heat sink 32. The multiple fins are arranged in parallel with one another at predetermined intervals inside the cooling water circulating space in such a state that the end faces thereof are in contact with the inner face of the lid. Thus, the heat-receiving side heat sink 32 serves as a water-cooling jacket structure for heat exchange between the fins and the cooling water because the cooling water circulates around the fins inside the cooling water circulating space.

In the water-cooling unit 48, cooling water with heat radiated from the radiator 44 by receiving a blast from the blast fan 49 is introduced into the heat-receiving side heat sink 32 through the circulation pump 46. The cooling water with heat from the heat-radiating side heat sink 29 recovered in the heat-receiving side heat sink 32 is introduced again into the radiator 44. Thus, the heat-receiving side heat sink 32 can cool the heat-radiating side heat sink 29 with a high cooling efficiency.

As illustrated in FIG. 4 and FIG. 5, the docking station 11 includes, inside the device chassis 33, a shutter driving mechanism 50, a lift mechanism 52, an eject mechanism 54, and a control unit 56.

The shutter driving mechanism 50 is a mechanism section configured to drive the shutter member 27 and the shutter member 40 to be opened and closed. The shutter driving mechanism 50 has an unillustrated electric motor, a rack gear or a link member driven by this electric motor to activate the shutter member 40 and a shutter-opening/closing member 58, and the like. The shutter-opening/closing member 58 is a thin plate-like member. The shutter driving mechanism 50 slidingly moves the shutter member 40 to be opened and closed under the control of the control unit 56. Further, the shutter driving mechanism 50 drives the shutter-opening/closing member 58 to rotate so as to open and close the shutter member 27 as well, where the shutter-opening/closing member 58 is inserted in a hole 16b formed in the bottom face 16a of the portable computing device 12 connected to the docking station 11.

The lift mechanism 52 is a mechanism section configured to drive the heat-receiving side heat sink 32 to move up and down. The lift mechanism 52 has an unillustrated electric motor, a guide member driven by this electric motor to lift the heat-receiving side heat sink 32 up and down, and the like. The lift mechanism 52 lifts the heat-receiving side heat sink 32 up and down under the control of the control unit 56. The piping 47 among the heat-receiving side heat sink 32 having the water-cooling jacket structure to be lifted up and down by the lift mechanism 52, the radiator 44, and the circulation pump 46 is made up of flexible hose-like members.

The eject mechanism 54 is a mechanism section configured to drive the engaging lever 30 and the eject member 42 when the portable computing device 12 connected to the docking station 11 is removed. As illustrated in FIG. 4, the eject mechanism 54 has an electric motor 60, a rack gear (driving member) 62, a swinging arm (moving member) 64, and a slide member 66.

The electric motor 60 is such that a worm gear 60a as the output shaft thereof is coupled to the rack gear 62 through a worm wheel 68. The rack gear 62 is provided to be movable in the front and rear direction on the inner face of the device chassis 33, and driven by the worm wheel 68 as a pinion gear to advance and retreat.

The swinging arm 64 is a long arm-like member extending in the right and left direction. The swinging arm 64 is swingable about a pivot shaft 64a provided substantially at the center. The rear end of the rack gear 62 is provided on one end side of the swinging arm 64 in a manner to be able to be pressed. When the rack gear 62 moves to the rear side, the swinging arm 64 swings clockwise in FIG. 4, while when the rack gear 62 moves to the front side, the swinging arm 64 swings counterclockwise in FIG. 4. The slide member 66 is coupled to the other end side of the swinging arm 64.

The slide member 66 moves in the front and rear direction along with the swinging of the swinging arm 64. The slide member 66 has an engagement releasing part 66a and a push-up part 66b. The engagement releasing part 66a is a part to move the engaging lever 30 in the releasing direction. The push-up part 66b is a part to push the eject member 42 up by the pressing action of an inclined face, not illustrated. The slide member 66 moves to the front side when the swinging arm 64 swings clockwise. When the slide member 66 moves to the front side, the engagement releasing part 66a moves the engaging lever 30 in the state of being engaged with the engaging hole 31 to release the engaged state, and then the push-up part 66b pushes up the eject member 42. This causes the bottom face 16a of the portable computing device 12 to be pushed up by the eject member 42 and hence the portable computing device 12 to pop up from the placing face 34a.

The control unit 56 performs not only the overall control of the docking station 11 but also the driving control of the water-cooling unit 48, the shutter driving mechanism 50, the lift mechanism 52, and the eject mechanism 54. In response to detection signals of a docking sensor 72 to be turned on and off by the engaging lever 30 and an On sensor 73 to be turned on and off by the bottom face 16a of the portable computing device 12, the control unit 56 controls switching of the docking station 11 from a standby state to an operating state. In the present disclosure, for example, the standby state means a state where the portable computing device 12 is not connected to the docking station 11 so that the detection signal from the docking sensor 72 will be receivable. In this standby state, the water-cooling unit 48, the shutter driving mechanism 50, the lift mechanism 52, and the eject mechanism 54 are in a stopped state. In other words, it can also be said that the standby state is a state where the docking station 11 waits for the detection signal from the docking sensor 72. In the present disclosure, for example, the operating state means a state where the portable computing device 12 is connected to the docking station 11 so that cooling operation by the water-cooling unit 48 will be being performed. The operation of each of the shutter driving mechanism 50, the lift mechanism 52, and the eject mechanism 54 is performed in the operating state. In other words, it can also be said that the operating state is a state where each mechanism of the docking station 11 is actually operating. Further, in response to a detection signal of a removal sensor 74 to be turned on and off by the supporting members 35L and 35R, the control unit 56 controls switching of the docking station 11 from the operating state to the standby state.

The control unit 56 may be implemented in such a manner, for example, that a program is executed by a processor such as a CPU, i.e., in software, implemented in hardware such as an IC (Integrated Circuit), or implemented by using the software and hardware in combination.

Figure 6A:
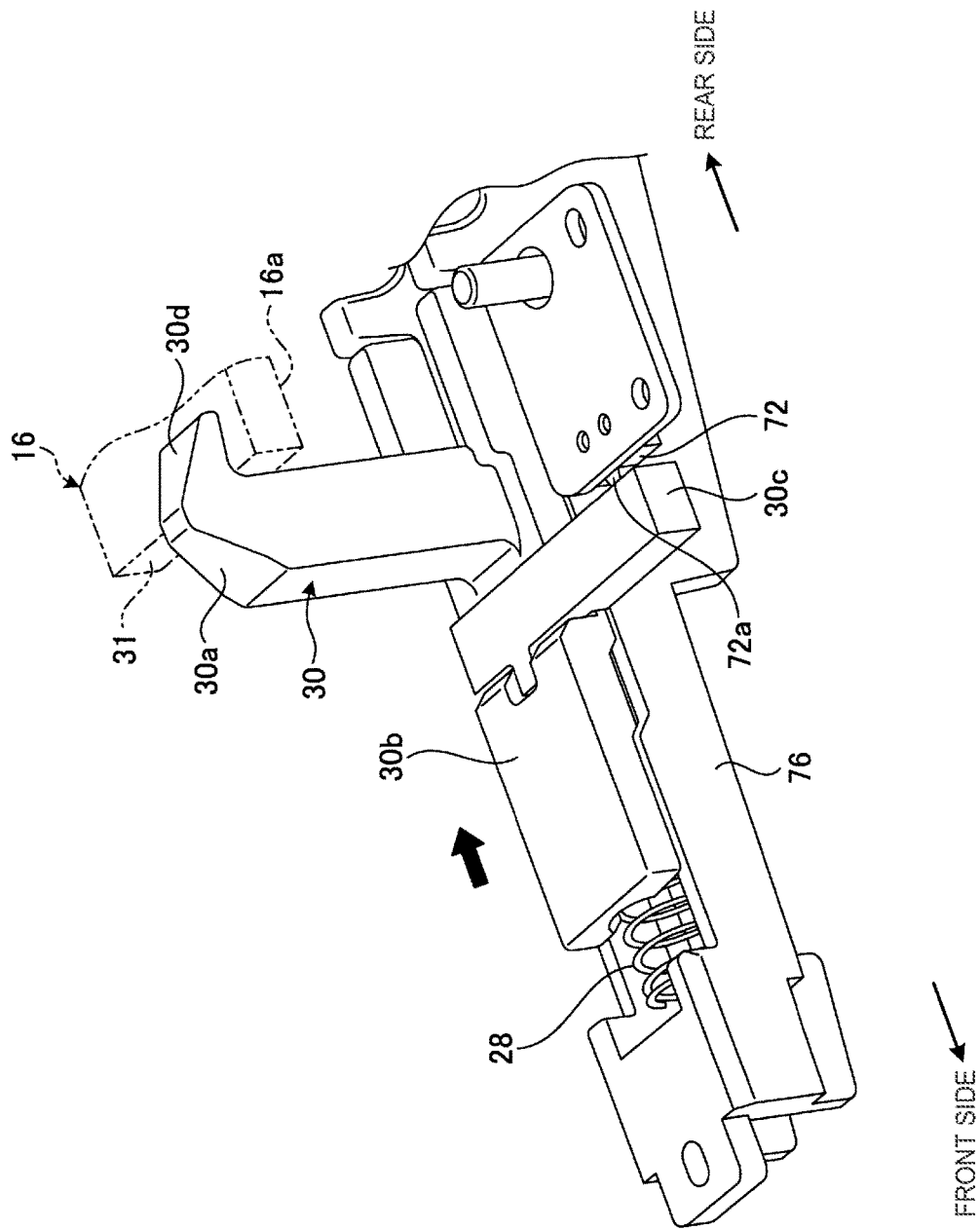
FIG. 6A is an enlarged perspective view of an engaging lever in a state of being engaged with an engaging hole and the vicinity.
Figure 6B:
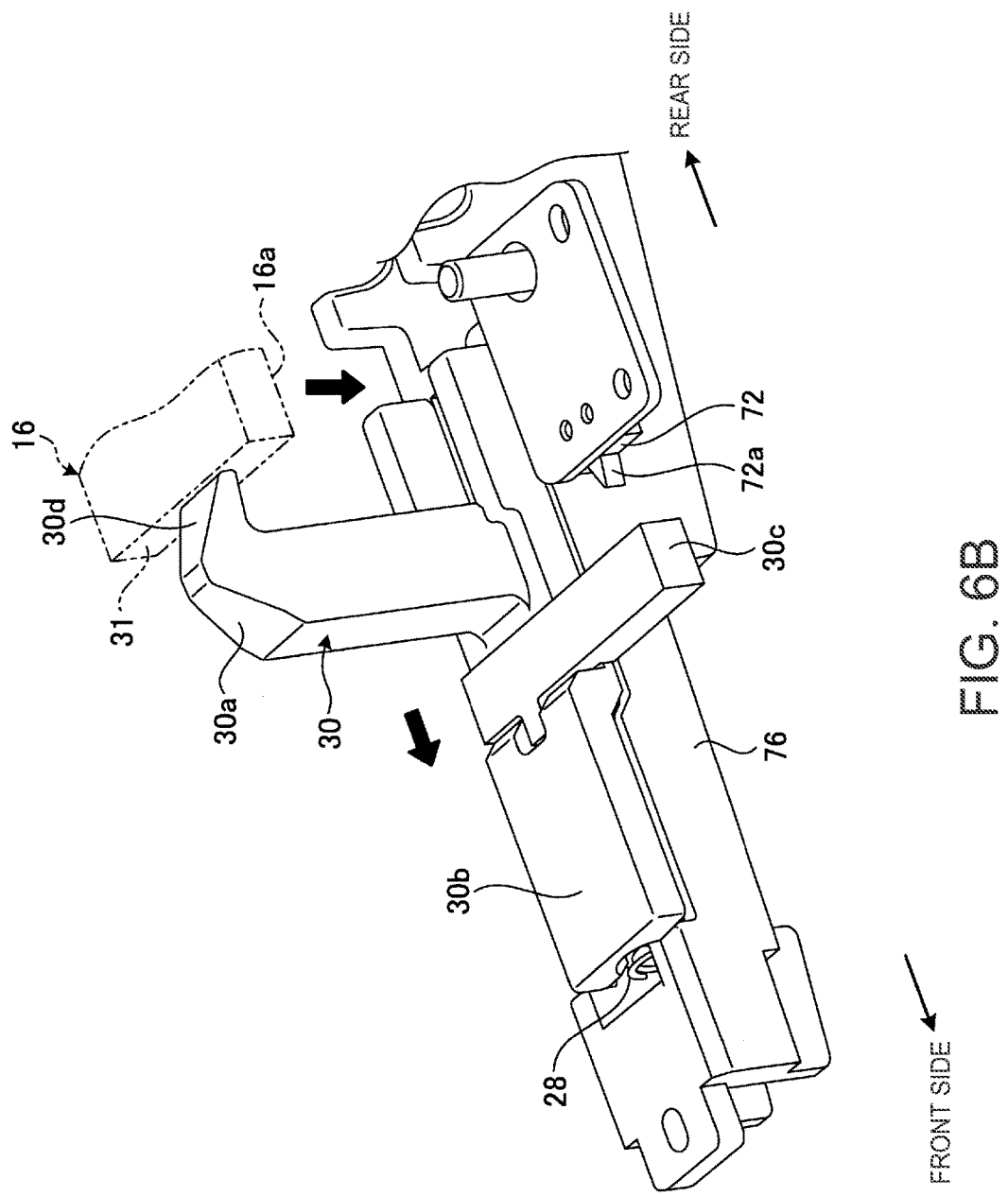
FIG. 6B is a perspective view illustrating an action to engage the engaging lever with the engaging hole.

FIG. 6A is an enlarged perspective view of the engaging lever 30 in a state of being engaged with the engaging hole 31 and the vicinity. FIG. 6B is a perspective view illustrating an action to engage the engaging lever 30 with the engaging hole 31.

As illustrated in FIG. 6A and FIG. 6B, the engaging lever 30 is provided on a slide base 76 fixed to the inner face of the device chassis 33 to be movable in the front and rear direction. The engaging lever 30 has a lever part 30a, a base part 30b, and a detection bar 30c.

The lever part 30a has the shape of a hook engageable with the engaging hole 31. A top face 30d of the lever part 30a has an inclined shape capable of slidingly contact a marginal part of the engaging hole 31. The base part 30b is a plate-like part extending in the front and rear direction, which is supported on the slide base 76 to be slidable in the front and rear direction. The lever spring 28 such as a coil spring is provided between the base part 30b and the slide base 76. The base part 30b is biased with respect to the slide base 76 toward a direction (rearward) of the lever part 30a to be engaged with the engaging hole 31 by the elastic force of the lever spring 28. The detection bar 30c is a part protruding laterally from substantially the center of the base part 30b in the front and rear direction.

The docking sensor 72 is provided near the engaging lever 30. The docking sensor 72 is fixed to the inner face of the device chassis 33 in a position at a side of the base part 30b and rear side of the detection bar 30c. The docking sensor 72 has a detection switch 72a provided to be able to come into contact with the detection bar 30c of the engaging lever 30. As illustrated in FIG. 6A, when the engaging lever 30 is in the position of being engaged with the engaging hole 31, the detection switch 72a is pressed by the detection bar 30c to transmit an On signal. As illustrated in FIG. 6B, when the engaging lever 30 moves forward from the position engaged with the engaging hole 31 against the biasing force of the lever spring 28, the pressing force of the detection bar 30c is released so that the detection switch 72a will transmit an Off signal.

Figure 7A:
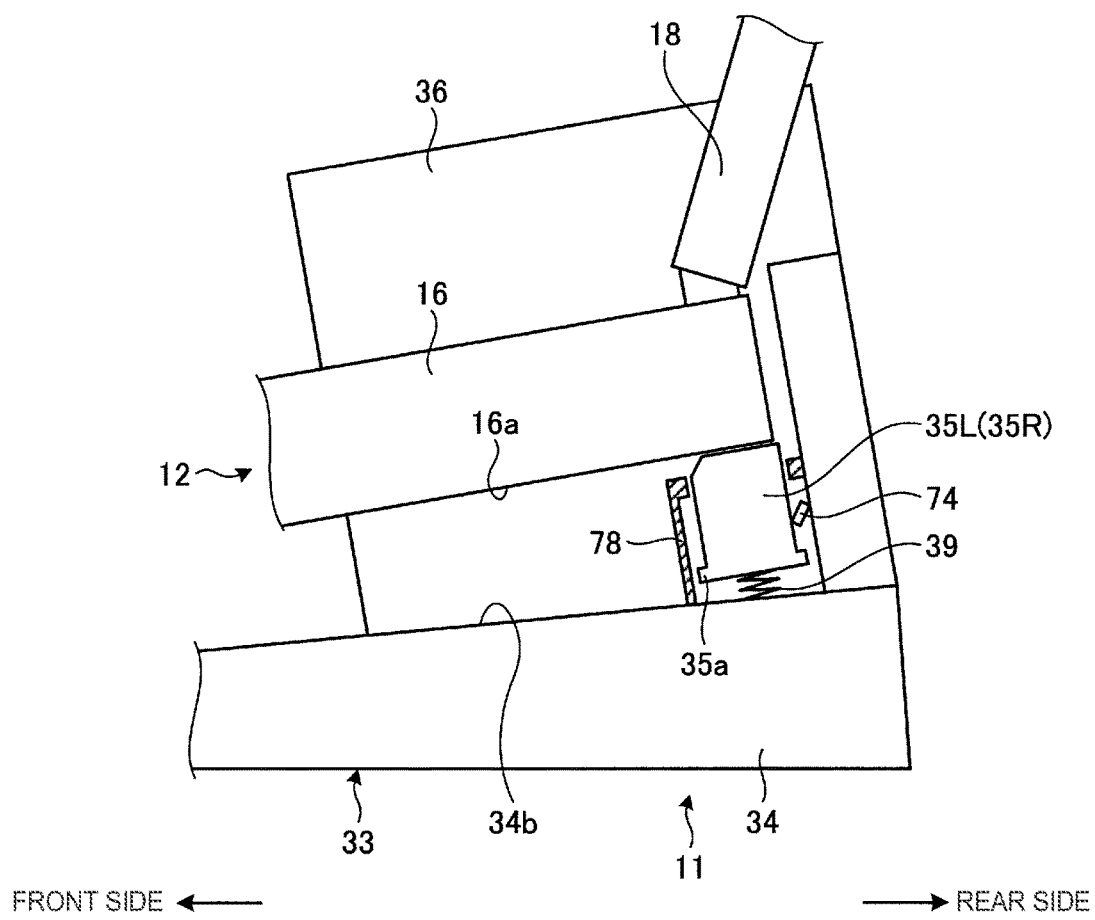
FIG. 7A is a side view schematically illustrating a state where a supporting member falls by the weight of the portable computing device.
Figure 7B:
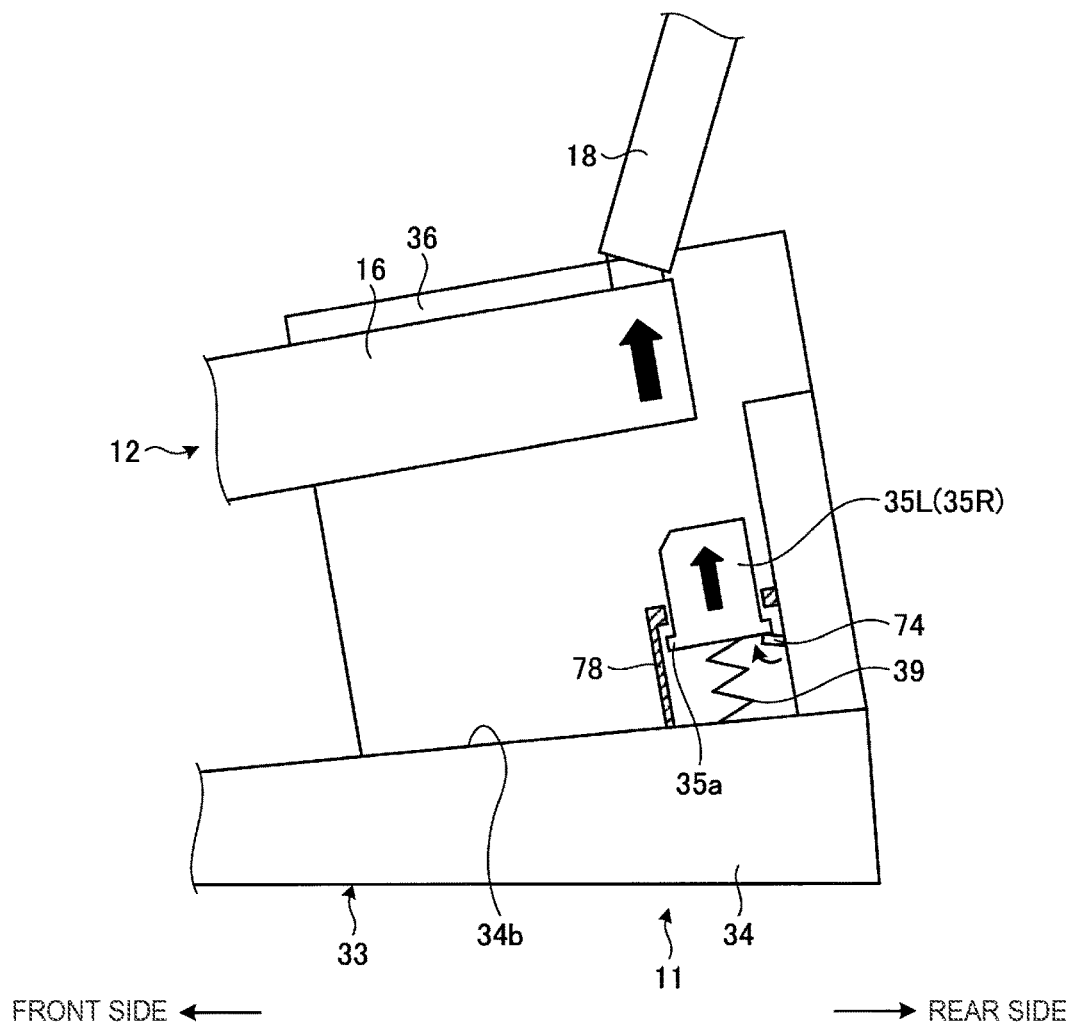
FIG. 7B is a side view schematically illustrating a state where the portable computing device is lifted up from the state illustrated in FIG. 7A and hence the supporting member rises.

FIG. 7A is a side view schematically illustrating a state where the supporting member 35L (35R) falls by the weight of the portable computing device 12. FIG. 7B is a side view schematically illustrating a state where the portable computing device 12 is lifted up from the state illustrated in FIG. 7A and hence the supporting member 35L (35R) rises.

As illustrated in FIG. 7A and FIG. 7B, the supporting member 35L, 35R is movable up and down in a state of protruding from an top face opening of a housing box 78 having a small box shape and provided on the flank face 34b of the PC placing part 34. The supporting member 35L, 35R is prevented from coming off the housing box 78 by means of a flange 35a protruding laterally from the outer circumferential surface of a lower marginal part thereof. The supporting member 35L, 35R is biased in the rising direction by the elastic body 39 provided inside the housing box 78. When being not given the weight of the portable computing device 12, the supporting member 35L, 35R is in a rising position by the biasing force of the elastic body 39 (see FIG. 7B)

A removal sensor 74 to be turned on and off by the supporting member 35L, 35R moving up and down is provided inside the housing box 78. The removal sensor 74 of the present disclosure is a swinging switch, which is swung up and down by the side surface of the supporting member 35L, 35R moving up and down to transmit an On/Off signal. When the supporting member 35L, 35R is located in a lowering position as illustrated in FIG. 7A, the removal sensor 74 transmits an On signal, while when the supporting member 35L, 35R is located in a rising position as illustrated in FIG. 7B, the removal sensor 74 transmits an Off signal. For example, the removal sensor 74 may also be an up-and-down type switch to be pressed by the bottom face of the supporting member 35L, 35R, or the like.

Next, the operation of the electronic device system 10 will be described.

First, when the portable computing device 12 is not docked on the docking station 11, the heat-radiating side heat sink 29 is closed by the shutter member 27 and the heat-receiving side heat sink 32 is closed by the shutter member 40. This prevents a user from touching the heat-radiating side heat sink 29 or the heat-receiving side heat sink 32 by mistake. At this time, the docking station 11 is in the standby state, and the control unit 56 is in a state of waiting for detection signals from the docking sensor 72 and the On sensor 73.

Next, when the portable computing device 12 is docked on the docking station 11 in the standby state, the connector 24 and the connector 25 are connected while inserting each engaging lever 30 of the portable computing device 12 into each engaging hole 31 as illustrated in FIG. 5. Thus, the connector 24 and the connector 25 are electrically connected. The engaging lever 30 is engaged with the engaging hole 31 to prevent the portable computing device 12 from being separated from the docking station 11. Further, the supporting member 35L, 35R is pushed down by the bottom face 16a of the portable computing device 12 and hence located in the lowering position, and the removal sensor 74 is put into a state of transmitting the On signal (see FIG. 7A).

During this docking operation, the top face 30d of the engaging lever 30 slidingly contacts the marginal part of the engaging hole 31 and once moves in a direction opposite to the direction of being engaged with the engaging hole 31 against the biasing force of the lever spring 28 (see FIG. 6B). Then, when the top face 30d climbs over the marginal part of the engaging hole 31, the engaging lever 30 moves in the engaged direction by the biasing force of the lever spring 28, and is engaged with the engaging hole 31 (see FIG. 6A). Therefore, after the Off signal is transmitted from the state where the detection switch 72a of the docking sensor 72 comes into contact with the engaging lever 30 to transmit the On signal, the docking sensor 72 transmits the On signal again. Note that the On sensor 73 is pressed to fall by the bottom face 16a of the portable computing device 12 so as to transmit the On signal.

When receiving the detection signals as the Off signal and the On signal sequentially transmitted from the docking sensor 72, and the detection signal as the On signal from the On sensor 73, the control unit 56 switches the docking station 11 from the standby state to the operating state. The On sensor 73 may be so omitted that the detection from the docking sensor 72 alone will be used to switch the docking station 11 from the standby state to the operating state.

When the docking station 11 is switched to the operating state, the shutter driving mechanism 50 is first activated under the control of the control unit 56 to open the shutter member 27 and the shutter member 40. Next, the lift mechanism 52 is activated to lift up and bring the heat-receiving side heat sink 32 into press contact with the heat-radiating side heat sink 29 so that both will stick fast to each other. After that, the control unit 56 controls the driving of the circulation pump 46 and the blast fan 49 at a predetermined rotational speed. Thus, heat generated by the heating element 43 of the portable computing device 12 is radiated from the radiator 44 to the outside via the heat-radiating side heat sink 29 and the heat-receiving side heat sink 32.

Next, the eject button 37 is operated to perform an undocking operation when the portable computing device 12 is removed from the docking station 11. This undocking operation may be performed by a software input operation using input means such as the keyboard 20 or an unillustrated mouse of the portable computing device 12.

When the undocking operation is performed, the control unit 56 activates the eject mechanism 54 to separate the engaging lever 30 from the engaging hole 31 and push up the eject member 42 so that the portable computing device 12 will pop up from the placing face 34a. Thus, the docking state of the portable computing device 12 and the docking station 11 is released.

Specifically, the electric motor 60 is driven to rotate under the control of the control unit 56. As a result, the rack gear 62 moves rearward through the worm gear 60a and the worm wheel 68 to cause the swinging arm 64 to swing clockwise in FIG. 4. Thus, the slide member 66 advances and the engaged state of the engaging lever 30 with the engaging hole 31 is released by the engagement releasing part 66a. Subsequently, the eject member 42 is pushed up by the push-up part 66b, and the portable computing device 12 pops up from the placing face 34a to release the docking state with the docking station 11. When the docking state of the docking station 11 and the portable computing device 12 is released, the rack gear 62 is detected by a position detecting sensor 86 and the electric motor 60 is stopped. After the electric motor 60 is stopped, the swinging arm 64 returns to the original position while pressing the rack gear 62 to move by a biasing force of the lever spring 28 or an unillustrated spring provided in the swinging arm 64.

After the portable computing device 12 pops up, a user holds up the portable computing device 12 from the placing face 34a. As a result, the supporting members 35L and 35R rise as illustrated in FIG. 7B, and the removal sensor 74 transmits the Off signal. Then, the control unit 56 activates the lift mechanism 52 to lift down the heat-receiving side heat sink 32 so as to separate it from the heat-radiating side heat sink 29. Subsequently, the control unit 56 activates the shutter driving mechanism 50 to close the shutter member 27 and the shutter member 40. Thus, since the removal of the portable computing device 12 from the docking station 11 is completely finished, the control unit 56 switches the docking station 11 again from the operating state to the standby state.

As described above, the docking station 11 according to the present disclosure includes the engaging lever 30 engageable with the engaging hole 31 provided in the portable computing device 12, and the docking sensor 72 which detects that the engaging lever 30 is engaged with the engaging hole 31. Thus, the state where the engaging lever 30 is engaged with the engaging hole 31 to dock the portable computing device 12 on the docking station 11 can be detected appropriately.

In the present disclosure, the control unit 56 is included to switch the docking station 11 from the standby state to the operating state in response to the detection signal from the docking sensor 72. The docking station 11 is controlled to switch from the standby state to the operating state in response to the detection signal from the docking sensor 72, which detects that the engaging lever 30 is engaged with the engaging hole 31. Thus, the state is switched to the operating state after the engaging lever 30 is engaged with the engaging hole 31 to dock the portable computing device 12 on the docking station 11 in order to perform the operation of the shutter driving mechanism 50, the lift mechanism 52, the water-cooling unit 48, and the like. This prevents switching to the operating state in such a state that the engaging lever 30 is not engaged with the engaging hole 31 not to cause any problem in the operation of the shutter driving mechanism 50, and the like.

In the present disclosure, when receiving the detection signals as the Off signal transmitted from the docking sensor 72 when the engaging lever 30 moves in a direction opposite to the direction of being engaged with the engaging hole 31, and the On signal transmitted from the docking sensor 72 when the engaging lever 30 moves in the engaged direction, the control unit 56 performs control to switch the docking station 11 from the standby state to the operating state. Thus, the engaging action of the engaging lever 30 correlates with the detection signals from the docking sensor 72 to prevent switching to the operating state due to false detection.

In the present disclosure, the docking station 11 configured to connect the connector 25 of the portable computing device 12 to the connector 24 of the placing face 34a in the vertical direction is exemplified. However, the connection direction between the connectors 24 and 25 may be horizontal. When the connectors 24 and 25 are connected in the horizontal direction, the connector 25 on the side of the docking station 11 can be moved horizontally using unillustrated electric motor, rack gear, and the like. Therefore, control of the movement of this connector 25 may be performed after switching to the operating state in response to the detection signal of the docking sensor 72. This enables smooth connection without causing any misalignment between the connectors 24 and 25, and the like.

The docking station 11 according to the present disclosure includes: the placing face 34a on which the bottom face 16a of the portable computing device 12 is placed; supporting members 35L and 35R each of which supports, on the rear side of the placing face 34a, a rear end portion of the bottom face 16a of the portable computing device 12 in a manner to be movable up and down; the elastic body 39 which biases the supporting members 35L, 35R in the rising direction; and the removal sensor 74 which detects that the portable computing device 12 is removed to release the supporting members 35L and 35R, located in the lowering position by the weight of the portable computing device 12, from the weight of the portable computing device 12 and hence to move the supporting members 35L and 35R to the rising position. Here, when the removal sensor 74 detects that the supporting members 35L and 35R move to the rising position, the control unit 56 switches the docking station 11 from the operating state to the standby state.

As mentioned above, the portable computing device 12 in the present disclosure is a laptop PC. As will be apparent from FIG. 1 and FIG. 7A, the weighted center of the portable computing device 12 becomes close to the rear side when the display chassis 18 is open. Therefore, if the removal sensor 74 is arranged on the front end side of the placing face 34a, it is possible for the removal sensor 74 to transmit the Off signal due to false detection after the portable computing device 12 pops up by the eject member 42 and before the user holds up the portable computing device 12.

In contrast, in the present disclosure, the removal sensor 74, which detects the vertical position of the supporting members 35L and 35R supporting the rear end portions of the bottom face 16a of the portable computing device 12 in a manner to be movable up and down, is used to perform control to switch from the operating state to the standby state. Therefore, the shutter driving mechanism 50 and the lift mechanism 52 operate in the state where the portable computing device 12 is placed on the placing face 34a to prevent any problem in this operation.

In the present disclosure, the removal sensor 74 is provided for each of the two supporting members 35L and 35R, respectively. However, the removal sensor 74 may be provided only for either the supporting member 35L or the supporting member 35R.

It is needless to say that the present invention is not limited to the above disclosed content, and changes can be made freely without departing from the spirit of the present invention.

We claim:

1. A docking station comprising:
    an engaging lever engageable with an engaging hole located in a portable computing device;
    a docking sensor which detects when the engaging lever is engaged with the engaging hole;
    a control unit which receives a detection signal from the docking sensor to switch the docking station from a standby state to an operating state;
    a heat-receiving side heat sink thermally connected to a heat-radiating side heat sink that is thermally connected to a heating element mounted in the portable computing device to absorb heat of the heating element;
    a placing face configured to receive a bottom face of the portable computing device; and
    a lift mechanism configured to lift the heat-receiving side heat sink up toward and brought into contact with the heat-radiating side heat sink located on the bottom face of the portable computing device,
    wherein, when the docking sensor detects that the engaging lever is engaged with the engaging hole, the lift mechanism performs an action to lift the heat-receiving side heat sink.

2. The docking station according to claim 1, further comprising:
    a lever spring which biases the engaging lever in a direction of being engaged with the engaging hole,
    wherein the engaging lever is pressed by a marginal part of the engaging hole when the portable computing device is docked on the docking station to move in a direction opposite to the engaged direction against a biasing force of the lever spring, and then move in the engaged direction of the biasing force of the lever spring so as to be engaged with the engaging hole; and when an Off signal is transmitted from the docking sensor the engaging lever moves in an opposite direction from the engaged direction and when an On signal is transmitted from the docking sensor the engaging lever moves into the engaged direction wherein the control unit controls switching from the standby state to the operating state.

3. The docking station according to claim 1, further comprising:
a shutter member located on the placing face to cover the heat-receiving side heat sink openably and closably;
wherein, when the docking sensor detects that the engaging lever is engaged with the engaging hole, the shutter member performs an opening action before the heat-receiving side heat sink is lifted by the lift mechanism.

4. The docking station according to claim 1, further comprising:
a water-cooling unit connected to a radiator, the heat-receiving side heat sink, and a circulation pump through piping to circulate cooling water.

5. A docking station comprising:
an engaging lever engageable with an engaging hole located in a portable computing device;
a docking sensor which detects when the engaging lever is engaged with the engaging hole;
a placing face configured to receive a bottom face of the portable computing device;
a supporting member located on a rear side of the placing face and configured to support a rear end portion of the bottom face of the portable computing device in a manner to be movable up and down;
an elastic body configured to bias the supporting member in a rising direction;
a removal sensor configured to detect when the portable computing device is removed to release the supporting member from a lowered position by a weight of the portable computing device, and hence to move the supporting member to a raised position;
a control unit configured to switch the docking station from the operating state to the standby state when the removal sensor detects that the supporting member moves to the raised position;
a heat-receiving side heat sink thermally connected to a heat-radiating side heat sink that is thermally connected to a heating element mounted in the portable computing device to absorb heat of the heating element; and
a lift mechanism configured to lift the heat-receiving side heat sink up toward and brought into contact with the heat-radiating side heat sink located on the bottom face of the portable computing device;
wherein, when the removal sensor detects that the supporting member moves to a raised position, the lift mechanism performs an action to lower the heat-receiving side heat sink.

6. The docking station according to claim 5, wherein:
the portable computing device has a clamshell type structure in which a rear end portion of a main body chassis having a keyboard and a rear end portion of a display chassis having a display are openably and closably coupled to each other via a hinge.

7. The docking station according to claim 5, further comprising:
a shutter member located on the placing face to cover the heat-receiving side heat sink openably and closably;
wherein, when the removal sensor detects that the supporting member moves to the raised position, the shutter member performs a closing action before the heat-receiving side heat sink is lifted up by the lift mechanism.

8. The docking station according to claim 5, further comprising:
a water-cooling unit connected to a radiator, the heat-receiving side heat sink, and a circulation pump through piping to circulate cooling water.

* * * * *